United States Patent
Hu et al.

(10) Patent No.: US 7,179,697 B2
(45) Date of Patent: Feb. 20, 2007

(54) METHOD OF FABRICATING AN ELECTRONIC DEVICE

(75) Inventors: Tarng-Shiang Hu, Hsinchu (TW);
Jia-Chong Ho, Taipei (TW);
Liang-Ying Huang, Hsinchu (TW);
Cheng-Chung Lee, TaiChung (TW)

(73) Assignee: Industrial Technology Research Institute, Hsinchu (TW)

(*) Notice: Subject to any disclaimer, the term of this patent is extended or adjusted under 35 U.S.C. 154(b) by 85 days.

(21) Appl. No.: 11/131,387

(22) Filed: May 18, 2005

(65) Prior Publication Data

US 2006/0079038 A1    Apr. 13, 2006

(30) Foreign Application Priority Data

Sep. 30, 2004   (TW) .............................. 93129519 A

(51) Int. Cl.
*H01L 21/00* (2006.01)
*H01L 21/84* (2006.01)
(52) U.S. Cl. .................. 438/158; 438/99; 438/159
(58) Field of Classification Search ................ 438/158, 438/99, 156–166; 257/E51.005, E51.006
See application file for complete search history.

(56) References Cited

U.S. PATENT DOCUMENTS

| | | | |
|---|---|---|---|
| 6,913,944 B2* | 7/2005 | Hirai | 438/99 |
| 2004/0129937 A1* | 7/2004 | Hirai | 257/40 |
| 2004/0132285 A1* | 7/2004 | Andideh et al. | 438/678 |
| 2005/0029514 A1* | 2/2005 | Moriya | 257/40 |
| 2005/0156163 A1* | 7/2005 | Hirai | 257/40 |
| 2005/0194615 A1* | 9/2005 | Huang et al. | 257/213 |

* cited by examiner

*Primary Examiner*—M. Wilczewski
*Assistant Examiner*—Seth Barnes
(74) *Attorney, Agent, or Firm*—Troxell Law Office, PLLC

(57) ABSTRACT

A method of fabricating an electronic device includes the following steps: a) providing a substrate; b) forming a first strip on the substrate; c) coating an insulation layer on the first strip and the substrate while completely overlaying the first strip and the substrate with the same; d) forming a second strip on the insulation layer; e) forming conductive polymer on the insulation layer while completely overlaying the second strip with the same; f) etching the conductive polymer via plasma etching for completely removing the conductive polymer on the second strip; and g) forming a semiconductor layer on the second strip and the conductive polymer.

8 Claims, 4 Drawing Sheets

METHOD OF FABRICATING AN ELECTRONIC DEVICE

FIELD OF THE INVENTION

The present invention relates to a method of fabricating an electronic device, and more particularly, to a method of fabricating a thin film transistor (TFT) by dry etching.

BACKGROUND OF THE INVENTION

Nowadays, TFT-LCDs (liquid crystal display) are commonly being applied to various electronic apparatus of information technology, such as monitors for personal computers, displays for notebook computers. That is, a TFT-LCD module consisting of a TFT-LCD panel, driving-circuit unit, backlight system, and assembly unit is commonly used to display characters and graphic images when connected a host system, wherein the TFT-LCD panel consists of a TFT-array substrate and a color-filter substrate. Moreover, The TFT-array substrate contains the TFTs, storage capacitors, pixel electrodes, and interconnect wiring, and the color filter contains the black matrix and resin film containing three primary-color—red, green, and blue—dyes or pigments. In this regard, the operation of the TFT-LCD is based on the use of the TFTs to actuate the pixel electrodes.

Therefore, the thin film transistor (TFT) plays an important role while fabricating a liquid crystal display (LCD). A conventional thin film transistor, especially a bottom-contact organic thin film transistor, has pixel electrodes fabricated by the photolithography process, which is capable of defining channel length easily, but have to go through a plurality of steps of exposing, developing, etching, and photoresist removing, etc. Hence, it is desired to reduce the steps of fabricating the thin film transistor for the LCD.

For example, a method of fabricating a thin film transistor is disclosed in R.O.C. Patent No. 518682 with reference to FIG. 1A to FIG. 1C. As seen in FIG. 1A to FIG. 1C, the method of fabricating the thin film transistor comprises the following steps:

a) providing a substrate 10 while forming a gate electrode 12 thereon;

b) coating a first dielectric layer 14 on the substrate 10 and the gate electrode 12 completely, and then coating a backfill dielectric layer 16 on the first dielectric layer 14;

c) etching the backfill dielectric layer 16 via plasma etching till the backfill dielectric layer 16 on the gate electrode 12 is completely removed, and consequently, forming a pair of patterning backfill dielectric layers 16a, 16b;

d) forming a patterning third dielectric layer 20 on an exposure portion of the first dielectric layer 14 and the pair of patterning backfill dielectric layers 16a, 16b, and further forming a patterning active semiconductor layer 22 aligning with the patterning third dielectric layer 20; and e) forming a pair of patterning ohmic contact layers 24a, 24b contacting each other respectively on the two end points of the patterning active semiconductor layer 22, and further forming a pair of patterning conducting layers 26a, 26b on the patterning ohmic contact layers 24a, 24b while respectively aligning with the same, wherein the patterning conducting layers 26a, 26b are employed as electrodes (drain/source).

Though a reliable thin film transistor structure may be fabricated through the above method, steps (exposing, developing, etching and photoresist removing) of the photolithography process are still complicated. Furthermore, when the insulation layer is made of an organic material, it is inconvenient to fabricate the patterning organic electrodes and it tends to be restricted by the material. When the electrodes are fabricated via printing, it is inconvenient to align.

SUMMARY OF THE INVENTION

It is the primary object of the present invention to provide a method of fabricating an electronic device, which is adapted for fabricating a thin film transistor via insulation layer patterning and dry etching (i.e. plasma etching) thereby simplifying process and realizing self-alignment.

To achieve the abovementioned object, a method of fabricating an electronic device in accordance with the present invention comprises the steps of:

(a) providing a substrate;

(b) forming a first strip on the substrate;

(c) coating an insulation layer on the first strip and the substrate for completely overlaying the first strip and the substrate with the same;

(d) forming a second strip on the insulation layer;

(e) forming a layer of conductive polymer on the insulation layer for completely overlaying the second strip with the same;

(f) etching the layer of conductive polymer via plasma etching enabling the conductive polymer covering the second strip to be removed completely; and (g) forming semiconductor layer on the second strip and the conductive polymer.

Wherein, in step (d), the second strip is formed via nano-imprint lithography, forward exposure or backward exposure of photolithography.

The following descriptions of drawings and preferred embodiment could be taken in conjunction with the accompanying auxiliary drawings to specifically explain the present invention and facilitate examiner to examine the present invention.

DESCRIPTION OF THE PREFERRED EMBODIMENT

Figure 1A:
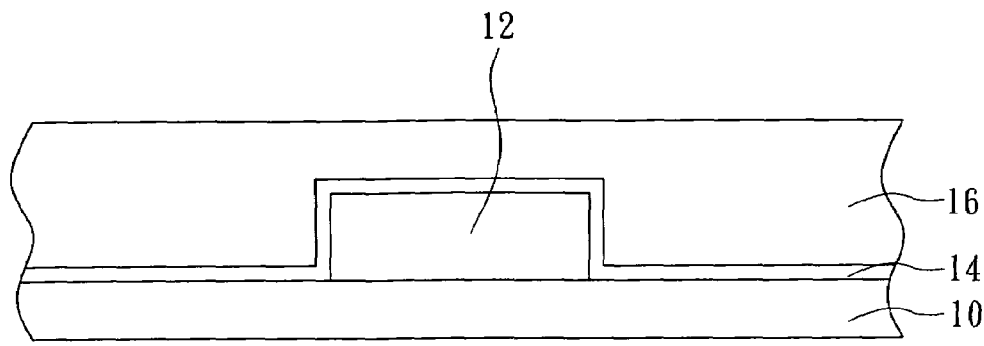
FIG. 1A to FIG. 1C are schematic illustrations respectively showing successive steps of a conventional method of fabricating a thin film transistor.
Figure 1B:
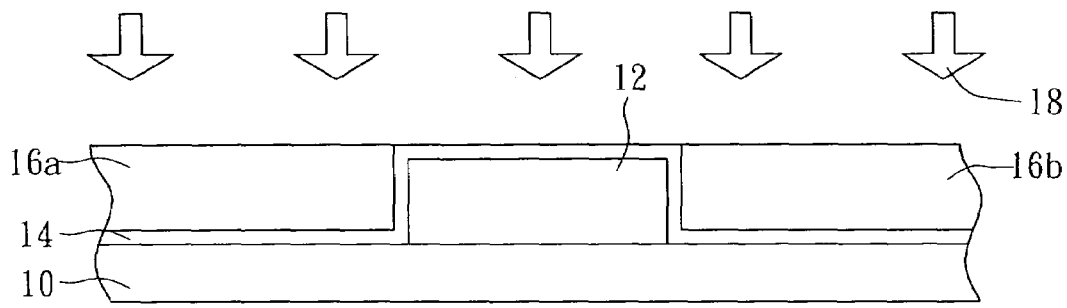
Figure 1C:
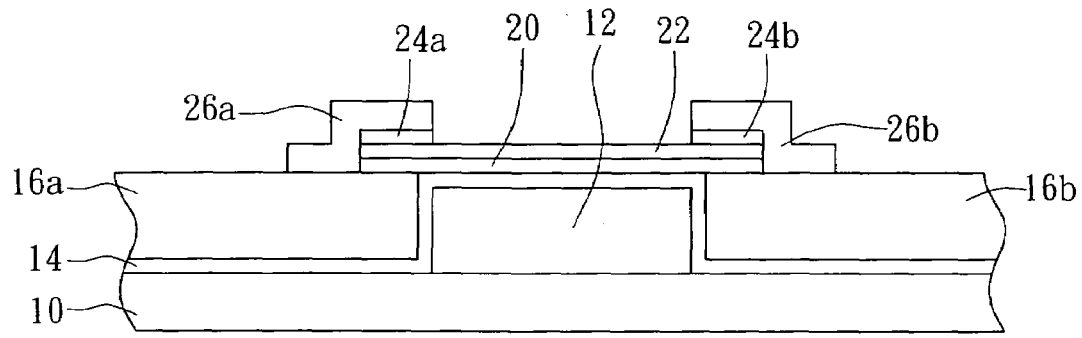
Figure 2:
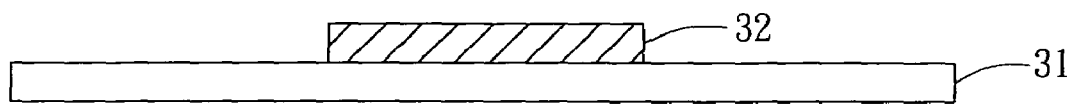
FIG. 2 to FIG. 7 are schematic illustrations respectively showing successive steps of a method of fabricating an electronic device according to the present invention.
Figure 3:
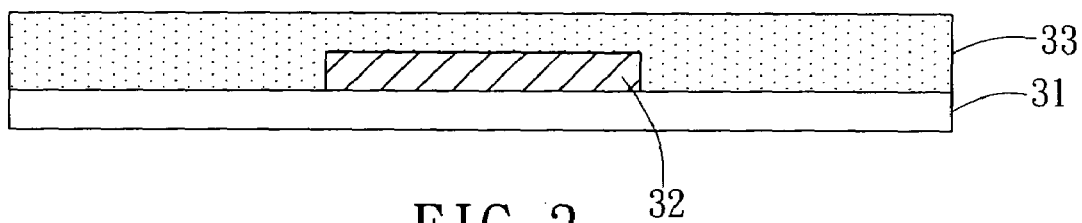
Figure 4:
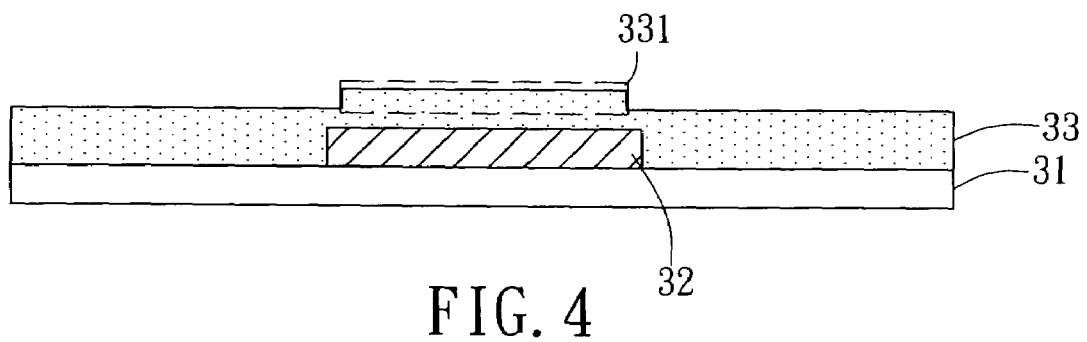
Figure 5:
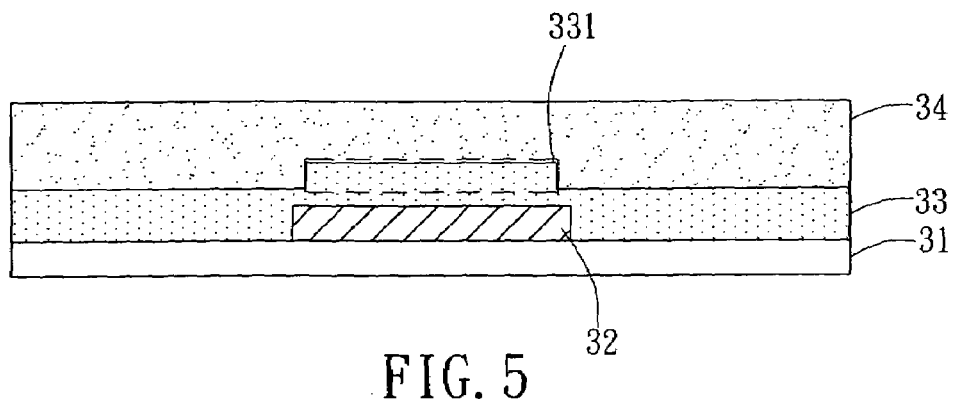
Figure 6:
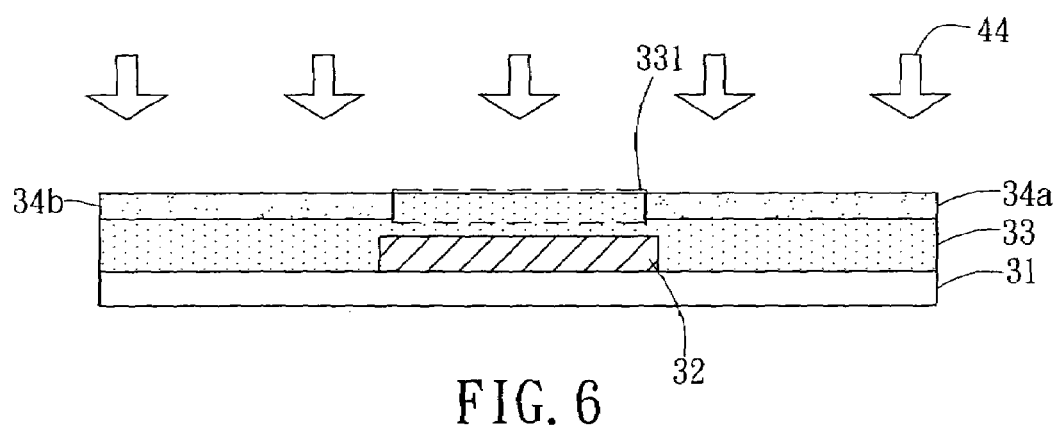
Figure 7:
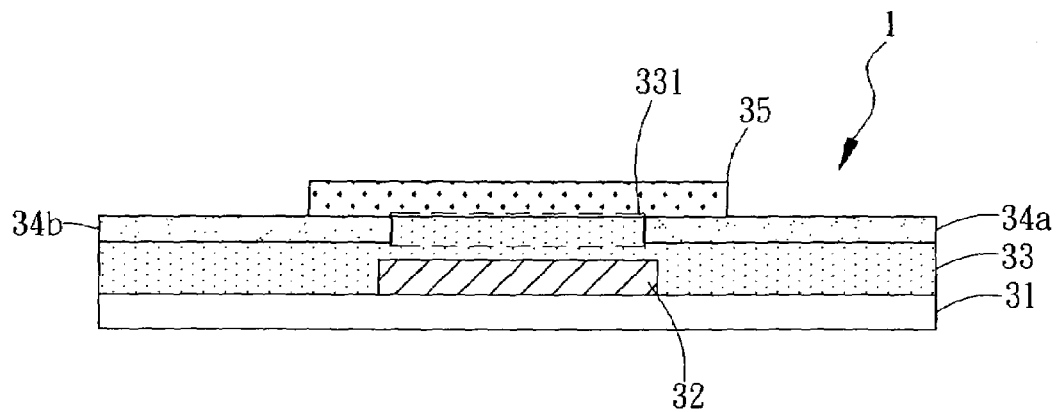

Please refer to FIGS. 2–7, which are schematic illustrations respectively showing successive steps of a method of fabricating an electronic device according to the present invention. Wherein, FIG. 2 illustrates the fabrication of a gate electrode, FIG. 3 illustrates the coating of an insulation layer, FIG. 4 illustrates the patterning of the insulation layer, FIG. 5 illustrates the forming of an electrode, FIG. 6 illustrates the etching process, and FIG. 7 illustrates the fabrication of an active layer.

Referring to FIG. 2, a substrate 31 is provided for forming a first strip 32 thereon, wherein the first strip 32 is employed as a gate electrode and is fabricated via a conventional semiconductor process, such as photolithography, shadow mask forming, ink-jet printing, screen printing, and contact printing, and so on.

Referring to FIG. 3, an insulation layer 33 is coated on the first strip 32 and the substrate 31 while completely overlaying the first strip 32 and the substrate 31 with the same, wherein conventional coating processes, such as spin coating and spin-slide coating, etc., may be used for the coating the insulation layer 33.

Figure 8A:
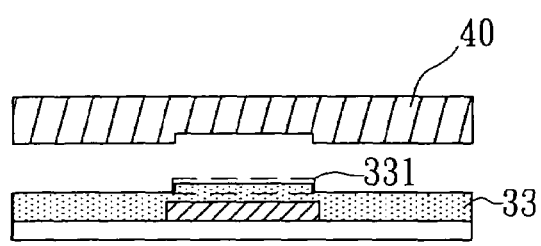
FIG. 8A is a schematic diagram showing an insulation layer is patterned via nano-imprint lithography according to the present invention.
Figure 8B:
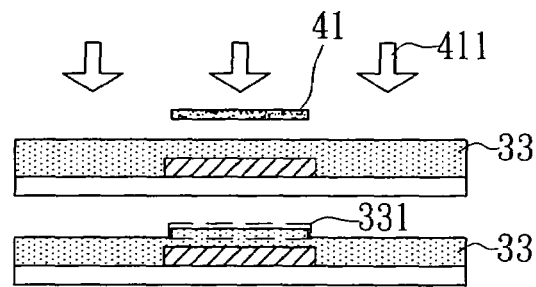
FIG. 8B is a schematic diagram showing an insulation layer is patterned via a photolithography process of forward exposure according to the present invention.
Figure 8C:
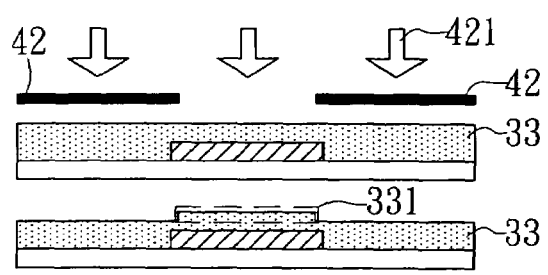
FIG. 8C is schematic diagram showing an insulation layer is patterned via a photolithography process of forward exposure according to another embodiment of the present invention.

Further, referring to FIG. 4, a second strip 331 is formed on the insulation layer 33, wherein the strip 331 is fabricated via nano-imprint lithography (as seen in FIG. 8A), photography process of forward exposure (as seen in FIG. 8B) or photography process of backward exposure (as seen in FIG. 8C). Of cause, the abovementioned process is given herein as an example but not limit the scope of the present invention.

Referring to FIG. 5, an conductive polymer 34 is coated on the insulation layer 33 while completely overlaying the second strip 331 with the same, wherein wherein conventional coating processes, such as spin coating and spin-slide coating, etc., may be used for the coating the conductive polymer 34.

Further referring to FIG. 6, a plasma 44 is used for etching the conductive polymer 34 until the conductive polymer 34 on the second strip 331 is completely removed enabling the conductive polymer 34a, 34b remaining at opposite sides of the second strip 331 to be employed as electrodes (source/drain). The second strip 331 may be fabricated with a relatively large thickness during the previous step of forming the second strip 331 for preventing the conductive polymer to be over-etched by the plasma 44. Therefore, when over etching, the thick second strip 331 can still ensure the electrical characteristics of a resulting device are not affected, that the resulting device is substantially a thin film transistor 1.

Finally referring to FIG. 7, a semiconductor layer 35 is formed on the second strip 331 and the conductive polymer 34a, 34b, wherein the semiconductor layer 35 is formed by a process selected from the group consisting of thermal evaporation, screen printing, ink-jet printing and contact printing.

FIG. 8A is a schematic diagram showing an insulation layer is patterned via nano-imprint lithography according to the present invention. As seen in FIG. 8A, the second strip 331 is formed by imprinting the insulation layer 33 with a mold 40.

FIG. 8B is a schematic diagram showing an insulation layer is patterned via a photolithography process of forward exposure according to the present invention. As seen in FIG. 8B, the second strip 331 is formed on the insulation layer 33 after a positive photoresist pattern 41 is exposed by a light source 411.

FIG. 8C is schematic diagram showing an insulation layer is patterned via a photolithography process of forward exposure according to another embodiment of the present invention. As seen in FIG. 8C, the second strip 331 is formed on the insulation layer 33 after a negative photoresist pattern 42 is exposed by a light source 421.

Figure 8D:
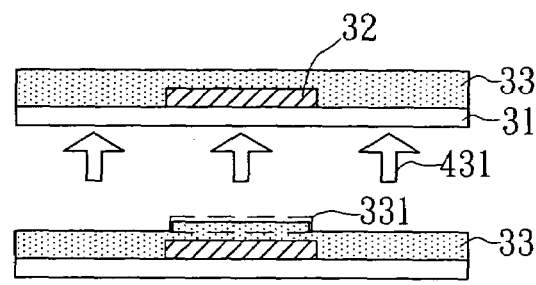
FIG. 8D is a schematic diagram showing an insulation layer is patterned via a photolithography process of backward exposure according to the present invention.

FIG. 8D is a schematic diagram showing an insulation layer is patterned via a photolithography process of backward exposure according to the present invention, which is adopted while the substrate 31 is made of a transparent material. As seen in FIG. 8D, since the substrate 31 is made of a transparent material and the first strip 32 is not transparent, the first strip 32 can act as a positive photoresist whereby the second strip 331 is formed on the insulation layer 33 after backward irradiation of a light source 431.

In the present invention, the substrate can be a silicon wafer substrate, a glass substrate, a quartz substrate, a plastic substrate or a flexible substrate. The first strip may be made of metal, conductive polymer or organic-inorganic hybrid electric conductive material. The insulation layer may be made of inorganic material, polymer or other high dielectric material (i.e. K>3). The conductive polymer may be an organic-inorganic hybrid electric conductive material. The semiconductor layer material may be made of an organic semiconductor material. Of cause, the above-mentioned material is given herein as an example but not limit the application scope of the present invention. The method of fabricating an electronic device of the present invention can employ any conventional (organic) thin film transistor material as long as the material is applicable to the electronic device.

While the preferred embodiment of the invention has been set forth for the purpose of disclosure, modifications of the disclosed embodiment of the invention as well as other embodiments thereof may occur to those skilled in the art. Accordingly, the appended claims are intended to cover all embodiments which do not depart from the spirit and scope of the invention.

What is claimed is:

1. A method of fabricating an electronic device, comprising the steps of:
   a) providing a substrate;
   b) forming a first strip on the substrate;
   c) coating an insulation layer on the first strip and the substrate while completely overlaying the first strip and the substrate with the same;
   d) forming a second strip on the insulation layer;
   e) forming a layer of conductive polymer on the insulation layer while completely overlaying the second strip with the same;
   f) etching the conductive polymer via plasma etching for completely removing the conductive polymer on the second strip; and
   g) forming a semiconductor layer on the second strip and the conductive polymer.

2. The method as recited in claim 1, wherein the substrate is selected from the group consisting of silicon wafer substrate, glass substrate, quartz substrate, plastic substrate and flexible substrate.

3. The method as recited in claim 1, wherein the insulation layer is made of a material selected from the group consisting of inorganic material, polymer and high dielectric materials.

4. The method as recited in claim 3, wherein the high dielectric material is substantially selected from the group consisting of materials of dielectric constant larger than 3.

5. The method as recited in claim 1, wherein the process for forming the second strip is a process selected from the group consisting of nano-imprint lithography, photolithography of forward exposure and photolithography of backward exposure.

6. The method as recited in claim 1, wherein the process for forming the semiconductor layer is a process selected from the group consisting of thermal evaporation, screen printing, ink-jet printing and contact printing.

7. The method as recited in claim 1, wherein the first strip is made of a material selected from the group consisting of metal, conductive polymer and organic-inorganic hybrid electric conductive material.

8. The method in claim 1, wherein the conductive polymer is substantially an organic-inorganic hybrid electric conductive material.

* * * * *